US007682659B1

(12) United States Patent
Wang et al.

(10) Patent No.: US 7,682,659 B1
(45) Date of Patent: Mar. 23, 2010

(54) FABRICATION OF SUSPENDED CARBON MICRO AND NANOSCALE STRUCTURES

(75) Inventors: Chunlei Wang, Irvine, CA (US);
Kartikeya Malladi, Irvine, CA (US);
Rabih B. Zaouk, Irvine, CA (US); Marc J. Madou, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 928 days.

(21) Appl. No.: 11/279,229

(22) Filed: Apr. 10, 2006

(51) Int. Cl.
*C23C 16/00* (2006.01)
(52) U.S. Cl. .................................. 427/249.1
(58) Field of Classification Search ............... 427/249.1
See application file for complete search history.

(56) References Cited

OTHER PUBLICATIONS

Jia et al. "A Novel Method for the Fabrication of High-Aspect Ratio C-MEMS Structures", Jornal of Microelectromechanical Systems, vol. 14, No. 2., Apr. 11, 2005.*

* cited by examiner

*Primary Examiner*—Roberts Culbert
(74) *Attorney, Agent, or Firm*—Orrick, Herrington & Sutcliffe LLP

(57) ABSTRACT

Methods for the fabrication of suspended carbon structures using a negative photoresist that is exposed to a source of UV light, and a two step pyrolysis process. Ebeam lithography is used to define the suspended structures. The fabrication method described herein provides a novel carbon microfabrication technique, which has potential applications in carbon based electronics, sensors, batteries, microfluidics, etc.

23 Claims, 12 Drawing Sheets

| Process | Sample1 | Sample2 | Sample3 | Sample4 |
|---|---|---|---|---|
| Pattern written without focusing and alignment | Yes | | | |
| Sputtering of Au without mask | | Yes | | |
| EB evaporation of Au without mask | | | Yes | |
| Sputtering of Au with a partial mask using a Si wafer | | | | Yes |
| Ability to develop in SU-8 developer before pyrolysis | Yes | No | No | Yes |

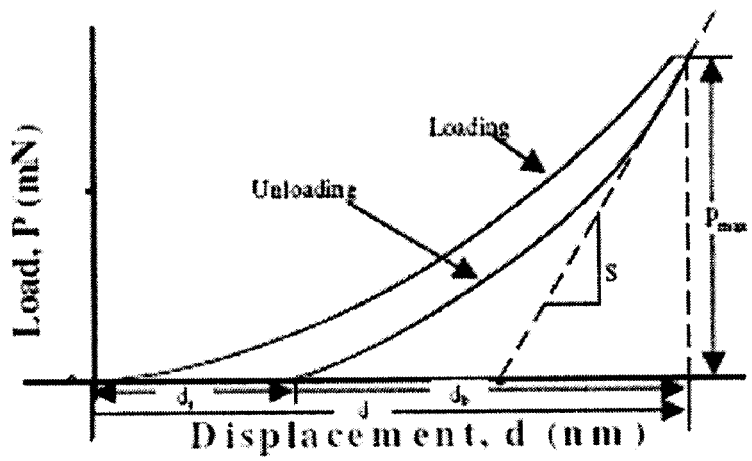
Fig. 20
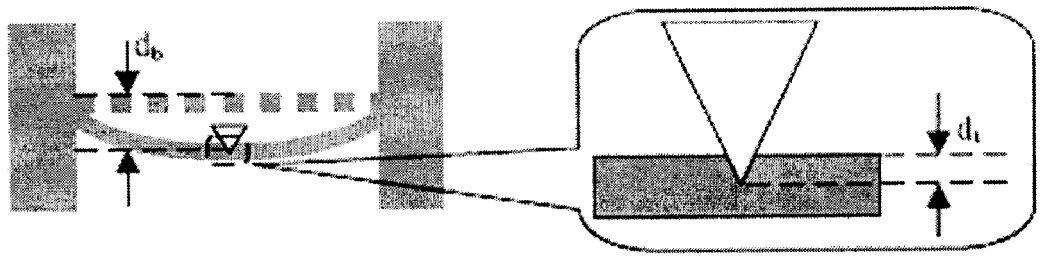
Fig. 21
| Force, P (mN) | Young's Modulus, E (GPa) |
|---|---|
| 2 | 6.45 |
| 3 | 6.79 |
| 5 | 8.22 |
| 10 | 10.03 |
| 20 | 11.1 |
| 100 | Yield |
Fig. 22

FABRICATION OF SUSPENDED CARBON MICRO AND NANOSCALE STRUCTURES

FIELD OF THE INVENTION

The present invention relates to carbon micro-electro-mechanical-systems (C-MEMS) and carbon nano-electro-mechanical-systems (C-NEMS) and, more particularly, to the fabrication of suspended carbon micro and nanoscale structures.

BACKGROUND OF THE INVENTION

Recent attention has focused on high aspect ratio carbon micro-electro-mechanical-systems (C-MEMS) because of the many applications that can be envisioned for C-MEMS such as micro-electrodes in electrochemical sensors and miniaturized energy storage/energy conversion devices. Some important C-MEMS properties include: the material has a very wide electrochemical stability window, it exhibits excellent biocompatibility, is low cost, is very reproducible, very fine geometries can be defined as opposed to the more traditionally used printing of carbon inks, a wide range of resistivities and mechanical properties can be obtained, and the surface of this very chemically inert material is easy to derivatize. The material has particular importance in bioMEMS applications including DNA arrays, glucose sensors, and micro-batteries. Further, suspended micro/nano carbon structures exhibit a wide electrochemical stability window and are also free of Van-der-waal's interactions with the substrate which makes them interesting for integration in mechanical, electrical, and electromechanical measurements. One of the biggest advantages of suspended micro/nano carbon structures is the high surface to volume ratio.

Yet, microfabrication of C-MEMS carbon structures using current processing technology, such as focus ion beam (FIB) and reactive ion etching (RIE), tends to be time consuming and expensive. Low feature resolution, and poor repeatability of the carbon composition as well as the widely varying properties of the resulting devices limits the application of screen printing of commercial carbon inks for C-MEMS. One promising C-MEMS microfabrication technique, however, is based on the pyrolysis of photo-patternable resists (photoresists) at different temperatures and different ambient atmospheres. The advantage of using photoresists as the starting material for the microfabrication of various carbon structures is that the photoresists can be very finely patterned by photolithography techniques and hence a wide variety of repeatable shapes are possible. Moreover different temperature treatments result in different resistivities and mechanical properties. Therefore, in comparison to techniques using other substances, methods using photoresist allow for superior repeatability of shape and dimension.

Most pyrolyzed photoresist structures described in the literature today concern carbon features derived from positive photoresist and are very low aspect ratio. The fabrication of high aspect ratio and dense C-MEMS patterns is a challenging problem because with increasing photoresist thickness, the requirements of any lithography process increase exponentially. Basically, it is very difficult to design a thick positive tone photoresist chemistry to achieve the necessary transparency and to achieve reasonable exposure doses while maintaining excellent sidewall angles. The LIGA process in which PMMA resist is exposed with an x-ray source has produced structures of the order of 1 mm in height and aspect ratios of over 50. However, this technique requires an expensive synchrotron source, hence the motivation for cheaper and easier processes.

Thus, it would be desirable to provide improved systems and methods for the controlled fabrication of suspended carbon micro/nano structures in desired positions and with the desired shape and dimension.

SUMMARY OF THE INVENTION

Described below are exemplary systems for and methods of fabricating suspended C-MEMS and C-NEMS structures. These systems and methods are examples only and are not intended to limit the invention.

The present invention provides a fabrication process which creates high aspect ratio (>10:1) carbon posts, carbon suspended bridges and wires, ribbons, self-organized bunches of carbon posts, carbon plates supported by carbon beams or posts, and the like. Carbon-micro and nano electromechanical systems (C-MEMS/NEMS) structures can be fabricated by the ultra-violet (UV)/electron beam lithography and pyrolysis methods disclosed herein. The starting material for the process is SU-8 photoresist, a negative photoresist. SU-8 is converted to desired carbon microstructures using pyrolysis in an inert atmosphere. A potential problem with the use of negative photoresists for the fabrication of C-MEMS structures is their oxygen sensitivity because the presence of oxygen inhibits cross-linking. However, by carefully controlling the lithography processing parameters and the heating conditions, a variety of complex three dimensional C-MEMS structures, such as high aspect ratio C-MEMS posts (carbon flowers) and ribbons (networks), can be built.

The methods and systems disclosed can accurately and reproducibly fabricate various suspended C-MEMS structures which have applications in microelectronics and biosensing. The fabricated C-MEMS structures have a huge potential in the development of novel biosensors since they can be functionalized to interact with the different biomolecules to detect molecular binding. Furthermore, the carbon post array can be reversibly discharged or charged with Li ions. This ability can greatly impact the application of C-MEMS in three-dimensional microbatteries.

Although the techniques disclosed result in shrinkage in both height and width, the C-MEMS structures mostly retain the original SU-8 photoresist shape. C-MEMS structures with aspect ratio larger than 10:1 can be successfully fabricated using a SU-8 negative photoresist and the two-step pyrolysis process. Two-level and multi-level C-MEMS processes can be used and aspect ratios substantially greater than 10:1 can be expected.

Other systems, methods, features, and advantages of the invention will be or will become apparent to one with skill in the art upon examination of the following figures and detailed description. It is intended that all such additional systems, methods, features and advantages be included within this description, be within the scope of this invention, and be protected by the accompanying claims. It will be understood that the particular methods and apparatus are shown by way of illustration only and not as limitations. As will be understood by those skilled in the art, the principles and features explained herein may be employed in various and numerous embodiments.

BRIEF DESCRIPTION OF THE DRAWINGS

FIG. 20 is a schematic representation of load versus indenter displacement data for an indention experiment.

FIG. 21 is a schematic of the deflection of the suspended beam.

FIG. 22 is a table showing the calculated Young's moduli for different forces.

It should be noted that elements of similar structures or functions are generally represented by like reference numerals for illustrative purpose throughout the figures. It should also be noted that the figures are only intended to facilitate the description of the preferred embodiments.

DETAILED DESCRIPTION OF THE PREFERRED EMBODIMENTS

Figure 2:
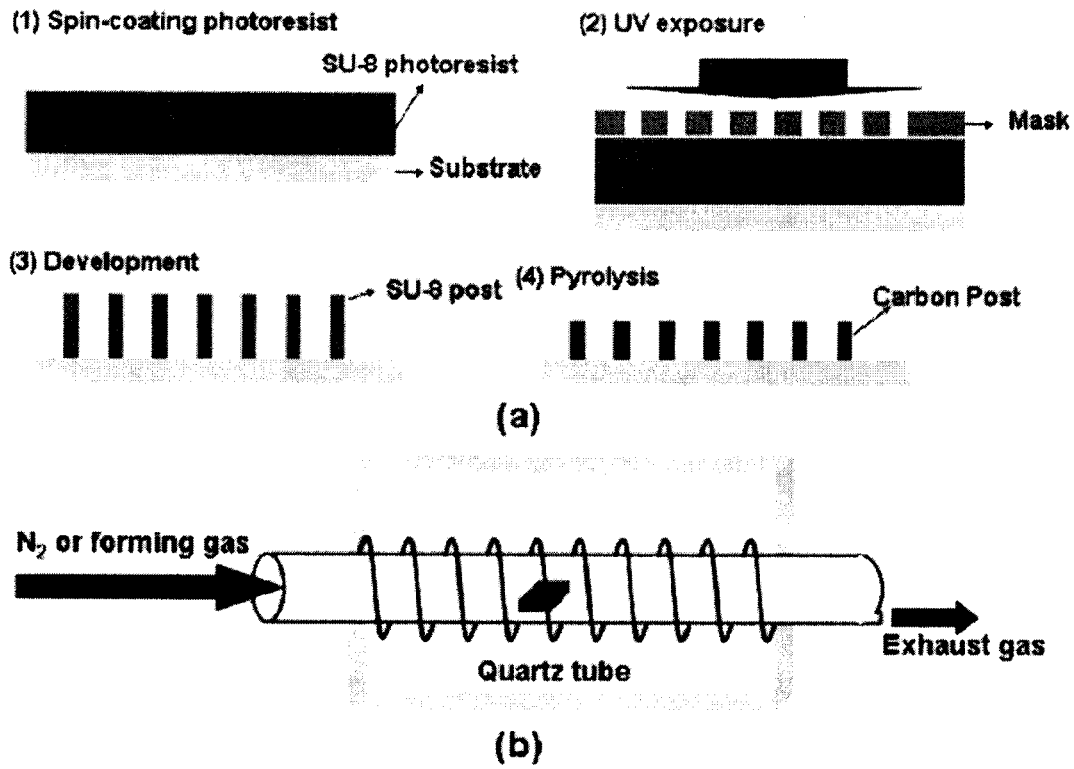
FIG. 2(a) is a flow diagram illustrating the process flow of an exemplary method of the present invention.
FIG. 2(b) is a schematic drawing of a furnace used in conjunction with the methods of present invention.

Disclosed herein are methods and systems for fabrication of suspended C-MEMS and C-NEMS structures by controlling the processor parameters using electron beam lithography and pyrolysis of photoresist. A SEM photograph of an example of one embodiment of suspended carbon microstructures fabricated by the methods disclosed herein is provided in FIG. 1. Prior to discussing the process of producing these suspended microstructures, an exemplary process flow for producing carbon post microstructures, as illustrated in FIG. 2, will be discussed.

Turning to FIG. 2(a), the fabrication process used to produced carbon post microstructures includes the steps of (1) spin coating (then soft bake (not shown)), (2) near UV exposure (then post bake (not shown)), (3) development and (4) pyrolysis. In this exemplary embodiment, a 200-μm-thick SU-8 photoresist film is spun at approximately 500 rpm for 12 seconds and then at 1400 rpm for 30 seconds, which is then followed by a ten minute soft bake at 65° C. and finally a soft bake at 95° C. for eighty minutes. Exposure can be performed in a Karl Suss MJB3 contact aligner for about one hundred seconds. The post bake can be carried out for 2 minutes at 65° C. and for 30 minutes at 95° C. Development was carried out using a SU-8 developer from MicroChem (NANO™ SU-8 Developer).

The photoresist can also be modified by adding Iron (III) oxide (0.03 g) nanopowder (Aldrich™, 5-25 nm) mixed into the SU-8 100 (20 g). In this embodiment, the procedure for patterning the standard SU-8 photoresist is used with the additional step of an overexposure process with exposed duration as long as five minutes with an intensity of almost 6 mW/cm$^2$ Photoresist-derived C-MEMS architectures can then be derived from a two-step pyrolysis process in an open ended quartz-tube furnace, such as that shown in FIG. 2(b). Samples are first post-baked in a $N_2$ atmosphere at 300° C. for about forty minutes. Then the samples are heated in the $N_2$ atmosphere (2000 sccm) up to 900° C. At this point, the $N_2$ gas is shut off and forming gas, $H_2$ (5%)/$N_2$, is introduced (2000 sccm) for one hour. Then the heater is turned off and the samples are cooled down again in a $N_2$ atmosphere to room temperature. The heating rate is typically about 10° C./min, and the total cooling time is approximately ten hours.

With the proper controls and process parameters, an array (180×180) of SU-8 posts (diameter: 50 μm, center to center distance: 100 μm) with straight walls and good edge definition can be fabricated. The average height of the SU-8 posts shown in two exemplary SEM photographs provided in FIGS. 11(a) and (b) is around 300 μm.

Figure 3:
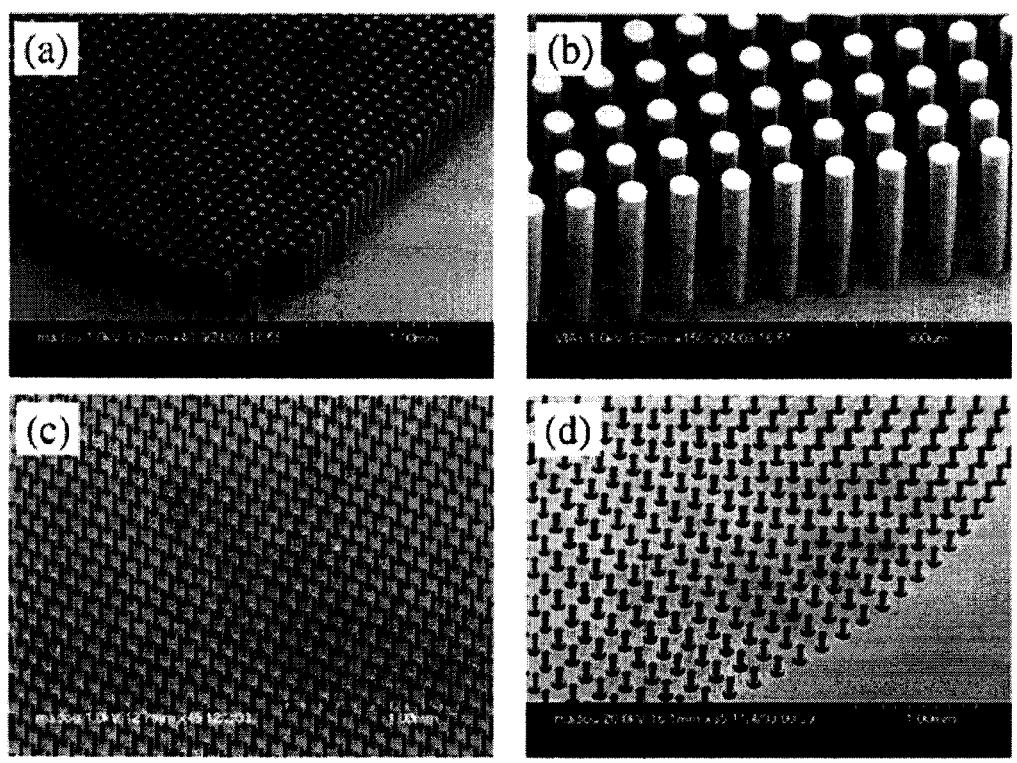
FIGS. 3(a) and (b) show typical SEM photos of SU-8 post arrays before pyrolysis.
FIGS. 3(c) and (d) show typical SEM photos of carbon post arrays after pyrolysis.

As shown in the SEM photographs provided in FIGS. 3(c) and (d), after pyrolysis, the overall shape of the cylindrical posts is largely retained. The typical aspect ratio of the carbon posts achieved is around 10:1. The carbon posts also shrink much less during the pyrolysis process near the base of the structures than at the midsection due to the good adhesion of SU-8 to the substrate. Shrinkage of the posts is also dependent on the overall height of the structure. For SU-8 posts with heights ranging from 100 to 350 μm, after pyrolysis, the corresponding carbon posts varied from 80 to 280 μm. Variation in the shrinkage of the posts clearly indicates that the different heights and sizes of the SU-8 patterns induce different amounts of shrinkage during pyrolysis. Compared to experiments conducted using positive photoresist, SU-8 gave less vertical shrinkage (<30%), as well as better adhesion after pyrolysis.

Despite the good adhesion of SU-8 to the Si substrate, C-MEMS post patterns do peel from the substrate when using a one step pyrolysis process at 900° C. in a vacuum furnace. This problem is solved by the two-step process described herein. There are three possible mechanisms that could account for this result: (1) the post-bake process cross-links the SU-8 better, thereby enhancing adhesion of the SU-8 to the substrate; (2) the SU-8 adhesion to the substrate results in tensile stress in the carbon posts near the interface and the two step heating process with its slow heating rate releases this stress more effectively; and (3) slower de-gassing occurs in a forming gas atmosphere. Heat-treatment during cross-linking generates gaseous byproducts and subsequent out-gassing can cause the formation of micro-cracks which disintegrate the sample. In vacuum, this out-gassing would tend to be faster and thus more destructive.

Figure 4:
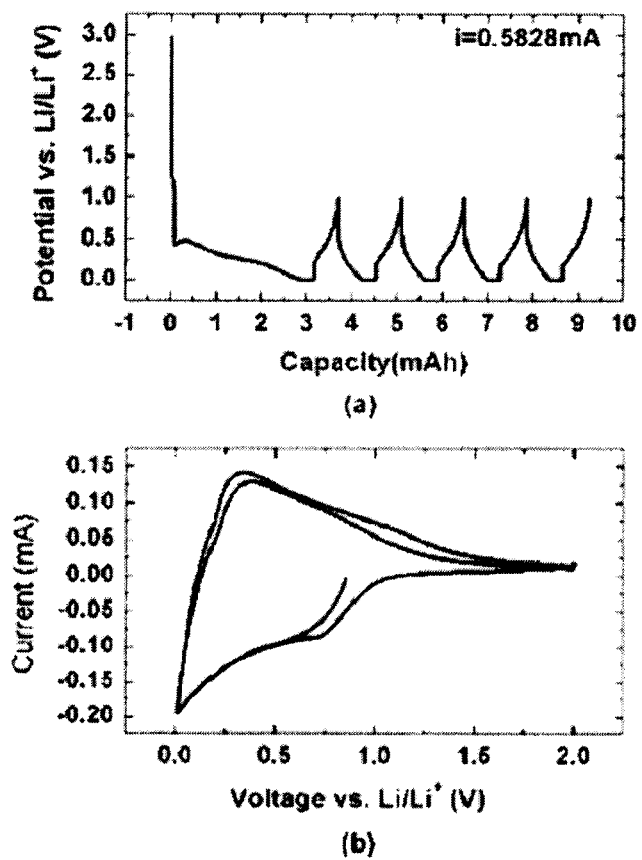
FIG. 4(a) charts galvanostatic lithium ion charge/discharge cycling behavior of patterned carbon arrays fabricated using the methods disclosed herein.
FIG. 4(b) charts cyclic voltammetry in lithium ion battery electrolyte of patterned carbon arrays fabricated using the methods disclosed herein.

The pyrolyzed SU-8 posts exhibit reversible intercalation/de-intercalation of lithium. This effect was shown in experiments to take electrochemical measurements using a three-electrode Teflon cell that employed an O-ring seal to define the working electrode to ~6.4 cm$^2$ (circle of 2.86 cm diameter). The carbon electrodes were used as the working electrode and a lithium ribbon (99.9% pure, Aldrich) was used as both the counter and reference electrode. The electrolyte was 1 M LiClO$_4$ in 1:1 volume mixture of ethylene carbonate (EC) and dimethyl carbonate (DMC). All the cells were assembled and tested in an argon filled glove box in which both the oxygen and moisture levels were less than 1 ppm. For the galvanostatic measurements, the current was based on the C/5 rate for graphite (corresponding to 50 µA and 580 µA for unpatterned and patterned films, respectively) and cells voltages varied between 10 mV and 1 V versus Li/Li$^+$. Battery performance measurements on those samples show a large irreversible capacity on the first discharge followed by good subsequent cycling behavior, which is consistent with the behavior of coke materials used as lithium electrode materials. Galvanostatic charge/discharge cycling behavior and a cyclic voltammogram of a patterned carbon array are shown in FIGS. 4(a) and (b). For a fully dense carbon film without any pattern, the capacity obtained was 0.070 mAh cm$^{-2}$ (~220 mAh g$^{-1}$) for the second and subsequent cycles. Furthermore, the normalized discharge capacity of a C-MEMS electrode array (180×180 posts with a thickness of ~150 µm) was 0.125 mAh cm$^{-2}$ for the second and subsequent cycles, exhibiting a nearly 80% higher capacity than that of the unpatterned carbon film. Therefore, C-MEMS provides a promising material and microfabrication solution to the current battery miniaturization problem.

Figure 1:
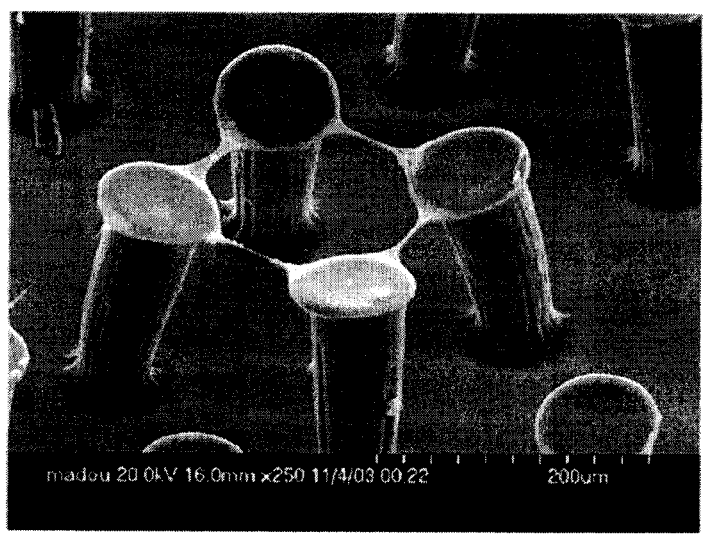
FIG. 1 is a SEM photograph of a suspended carbon microstructure fabricated by the methods disclosed herein.
Figures 5, 7:
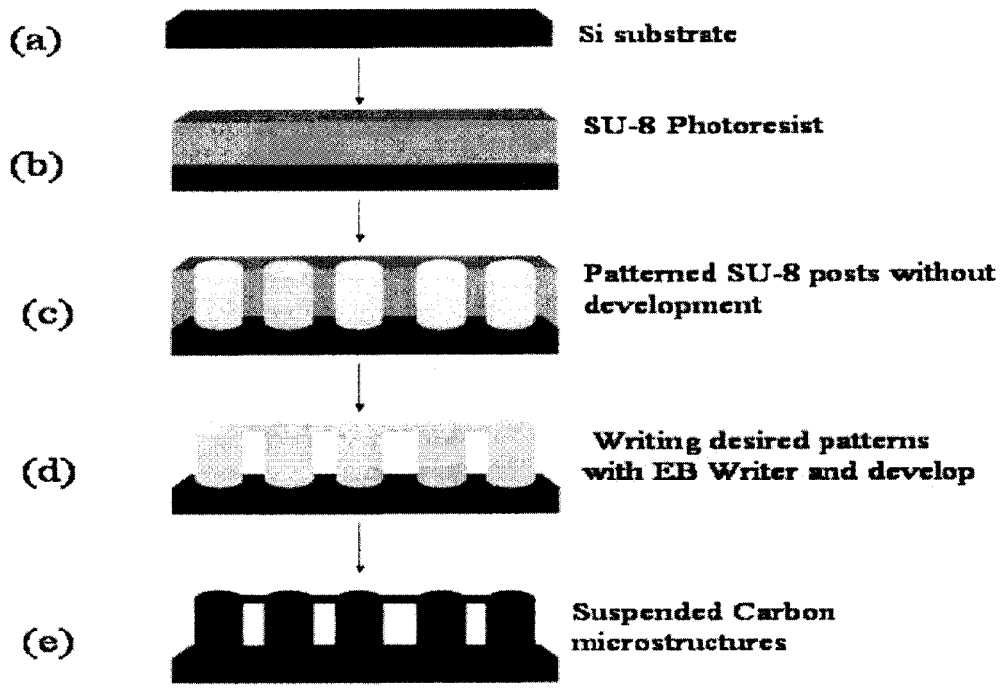
FIG. 5 is a flow diagram for fabricating suspended C-MEMS structures by the methods disclosed herein.
FIG. 7 is a table showing characteristics of each of samples 1-4.
Figure 6:
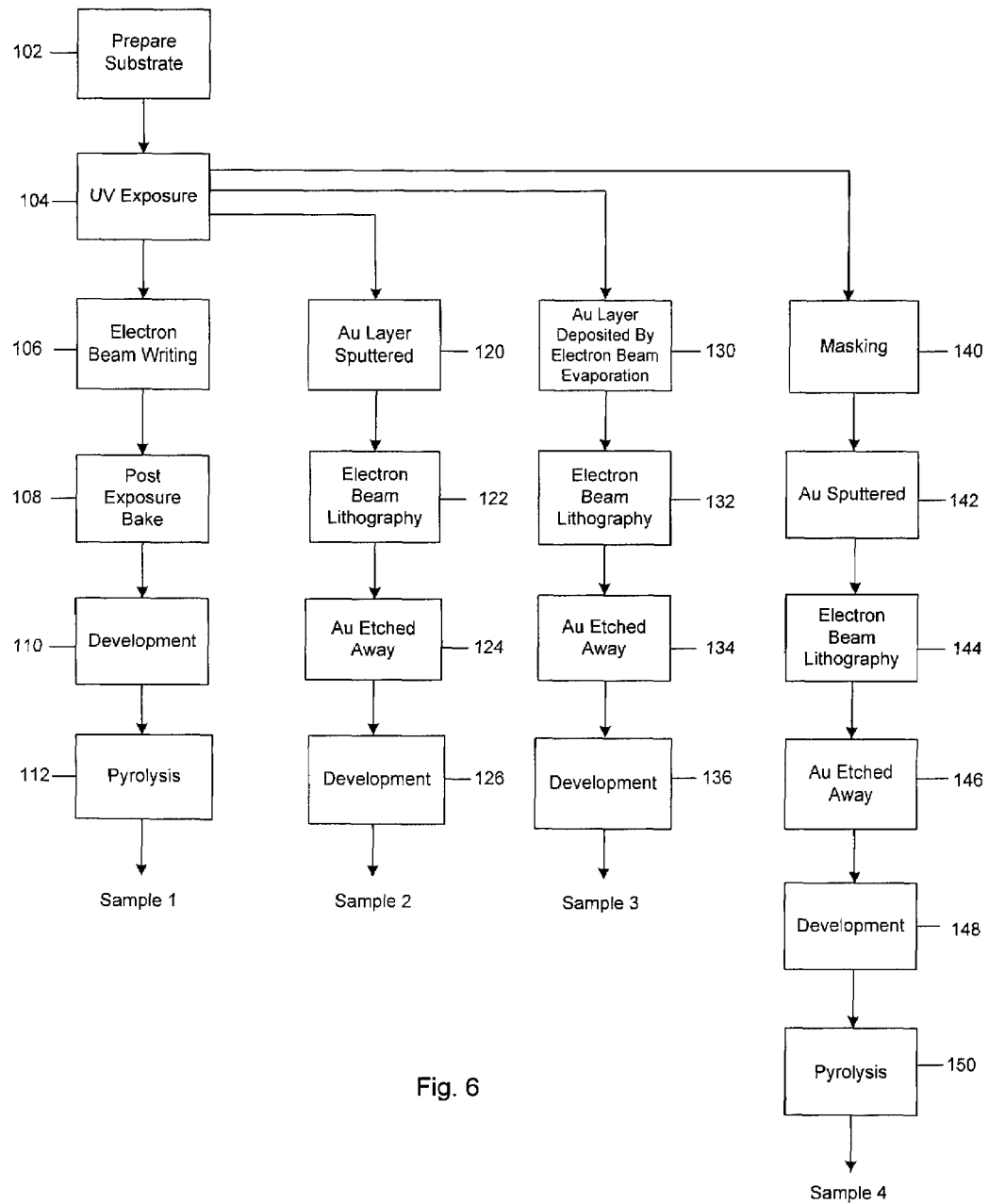
FIG. 6 is a flow diagram illustrating the fabrication methods for samples 1-4 by the methods disclosed herein.

Referring back FIG. 1 and the suspended carbon microstructures depicted therein, an exemplary embodiment of the process flow for fabricating suspended C-MEMS structures is shown in FIGS. 5 and 6. The substrate used is typically a Silicon (100) wafer, although other substrates known in the art can also be used. The substrate is first cleaned with acetone and isopropyl alcohol and prebaked to 95° C. for 30 minutes in a convection oven to remove all moisture (FIG. 6—step 102). NANO™ SU-8 100, a negative tone photoresist, is preferably used as the photoresist material. The SU-8 photoresist consists of an epoxy/phenolic resin, which mostly decomposes at temperatures below 600° C. This decomposition results in the shrinkage of the diameter/width of the carbon microstructures after pyrolysis to about 40% of the original dimensions. As discussed further below, after the high temperature pyrolysis process, the carbon posts and suspended bridges shrink isometrically, retaining a major part of their structure. The carbon structures retain similar shapes as the SU-8 microstructures. These suspended carbon microstructures, when pyrolysed, are about 10 µm in diameter and are about 50-70 µm in length. Miniaturization of the carbon structures to the nano-range is also possible using the techniques described herein. If desired, in further embodiments electron beam evaporation and sputtering methods can be used to deposit a variety of metals onto the photoresist. For example, thin films of Au, Ti, Cr, and Si can be deposited. Ti and Cr can be used as adhesion promotion layers for Au, and Au can be used a contact material for C-MEMS battery tests.

The thickness of the photoresist film can vary, but is generally in the range of approximately 70 to 130 µm. The photoresist film is spun onto the substrate, for example, by using a Laurell photoresist spinner at 500 rpm for 12 seconds, then at 1400 rpm for 30 seconds. The spinning step is followed by a 10 minute soft bake at 65° C. and another soft bake for 30 minutes at 95° C.

Next, the photoresist is exposed to UV light using a mercury lamp on an Oriel exposure tool (light intensity of 6 mw/cm$^2$) for about 125 seconds (step 104). The patterned photoresist (non-developed) samples are then transferred onto an electron beam writer such as the FRI Sirion Electron beam Lithography equipment, where the desired patterns are written using electron beam (20 kV) (step 106). The samples are then subjected to a post-exposure bake for 1 minute at 65° C. and for 10 minutes at 95° C. (step 108). Development is then carried out using an SU-8 developer, such as the Micro-Chem NANO™ SU-8 Developer, to get rid of the unwanted SU-8 and release the suspended SU-8 microstructures (step 110).

Photoresist-derived C-MEMS structures are then obtained as the result of a two-step pyrolysis process in, for example, an open ended quartz-tube diffusion furnace such as that shown in FIG. 2(b). The samples are post-baked in a N$_2$ atmosphere at 300° C. for about 30 minutes and then heated in a N$_2$ atmosphere (2000 sccm) up to 900° C. (FIG. 6—step 112).

The samples are held at 900° C. for one hour in a forming gas (5% H$_2$+95% N$_2$) environment (2000 sccm) after which the samples are allowed to cool down to room temperature in a N$_2$ atmosphere. The heating rate is about 10° C./min, and the total cooling time is about eight hours. The problem of charging the non-conductive SU-8 surface can be solved by partially masking a thin metal layer to prevent the repelling of the negative charged electrons before electron beam writing. Electron beam evaporation and sputtering methods can be used to deposit a thin film of Au to alleviate the charging up of SU-8. A Hitachi S-4700-2 field-emission scanning electron microscope (FESEM) can then be used to characterize the morphology of the C-MEMS structures.

Four different samples of suspended carbon microstructures were made using varied fabrication methods as illustrated in FIG. 6 and described further below. FIG. 7 is a table showing characteristics of each of the four samples. Sample 1 was fabricated using the fabrication methods disclosed above (FIG. 6—steps 102-112). For sample 2, the same fabrication steps were performed as with Sample 1 up to the UV exposure step (step 104). After the UV exposure, a thin layer (10 nm) of Au was sputtered (step 120) and then routine electron beam lithography of the desired pattern was performed (step 122). The Au was then etched away using a standard commercial gold etchant (KI+I$_2$+H$_2$O) (step 124), and then the unwanted photoresist was developed (step 126).

For sample 3, the typical fabrication steps described herein were again performed up to the UV exposure step (step 104). After the UV exposure, a thin layer (10 nm) of Au was deposited by electron beam evaporation (step 130) and then routine electron beam lithography of the desired pattern was performed (step 132). Then the Au was etched away (step 134) and the resist developed (step 136).

For sample 4, the standard lithography process was performed up to the UV exposure step (step 104) and then the area containing the posts and the pattern was masked partially with a piece of Si wafer (step 140). Subsequently the entire sample surface was sputtered with Au (10 nm) (step 142). Routine electron beam lithography of the desired pattern was then performed and the masking wafer removed (step 144). The Au was subsequently etched away (step 146) and the process of development of the unexposed photoresist is carried out (step 148) followed by the pyrolysis process (step 150).

Figure 8:
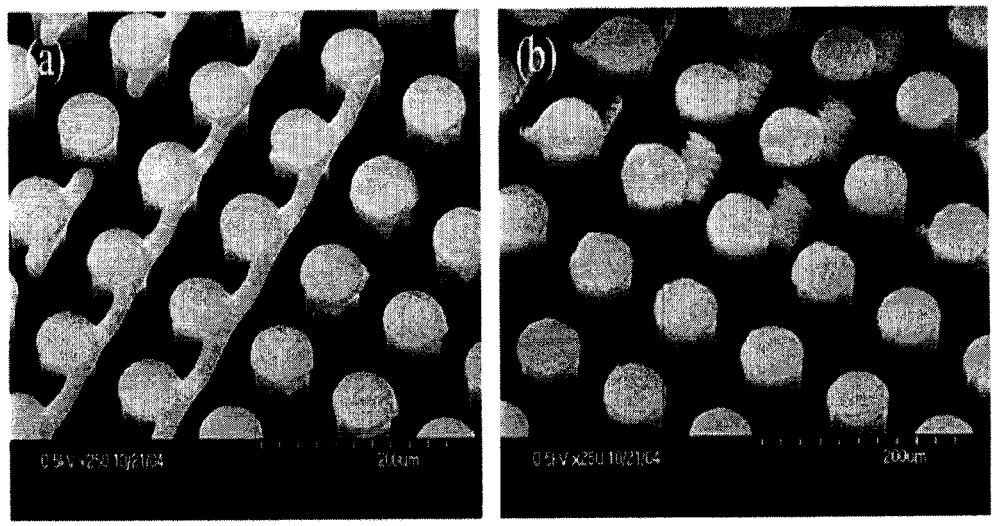
FIGS. 8(a) and (b) are SEM photos which illustrate typical suspended SU-8 microstructures from sample 1 of an exemplary method of the present invention.

FIG. 8 illustrates typical suspended SU-8 microstructures produced in sample 1. During the electron beam writing process for sample 1, the charging of the SU-8 resist made it difficult to focus the electron beam or align the electron beam patterns with the underlying SU-8 support structures. As shown in FIG. 8(a), the pattern is not well aligned with the underdeveloped SU-8 posts. FIG. 8(b) further shows evidence that the electron beam was not well focused on the SU-8 surface. Instead of the electron beam being properly focused on the surface of the SU-8, the beam was concentrated at a depth of about 10 μm below the surface. These alignment and focusing problems are a direct result of charging up nonconductive SU-8 resist during the electron beam writing of the suspended structures. The SU-8 resist does not provide an electrical path for the electrons to escape, thereby resulting in an accumulation of electrons. The repelling effect of the accumulated charge on the incoming electrons creates the resulting difficulty in focusing and aligning the electron beam.

Suspended SU-8 bridges of approximately 25 μm in width, 50 μm in length, and 10 μm in thickness were patterned between the SU-8 post arrays. In the original electron beam software "mask", the suspended bridges are 15 μm in width and 50 μm in length. The resolution, shape, and penetration depth of these SU-8 structures are dependent on the electron beam energy. Higher electron energies will result in penetration to greater depths. The resolution of the electron beam written structures is greater than the theoretical spot size of the focused beam because of the coulumbic effects between the incoming electron and electrons on the surface of the resist cause the beam to spread. Also, a scattering effect of the electron beam inside the resist is obtained due to the generation of secondary electrons, backscattering electrons, Auger electrons, and X-rays expose the resist further.

In order to avoid charging of the SU-8 surface, for sample 2 a thin 10 nm layer of gold was deposited over the entire sample using the sputtering system (FIG. 6—step 120). The suspended microstructures were patterned using the electron beam writer (step 122). The gold was subsequently removed using wet chemical etching (step 124), and the SU-8 was developed (step 126). It was found that a thin layer of SU-8 covering the entire sample could not be removed during the development process (step 126). This thin layer is visible in FIG. 9(a), which shows an SEM photo of sample 2. It appears that the high energy ions of the plasma and the UV from the sputter target bombarded the surface of the SU-8 and exposed the resist during the metal deposition.

Figure 9:
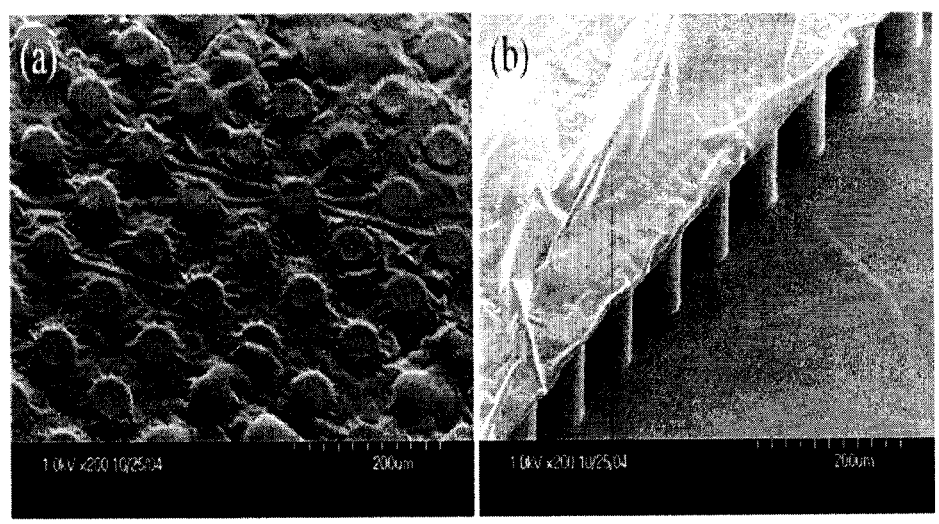
FIG. 9(a) illustrates SEM photos of SU-8 microstructures from sample 2 of an exemplary method of the present invention.
FIG. 9(b) illustrates SEM photos of SU-8 microstructures from sample 3 of an exemplary method of the present invention.

For sample 3 where the metal layer was deposited using electron beam evaporation (FIG. 6—step 130), a similar layer of SU-8 was formed. FIG. 9(b) shows SEM photos of sample 3. FIG. 9(b) demonstrates that the carbon posts are very well developed underneath the thin sheet of SU-8. For sample 3, it is theorized that during the electron beam evaporation process of the metal layer, the SU-8 surface was attacked and exposed by the highly energetic X-rays (caused by the striking of the metal target by the electron beam) resulting in the observed surface cross linking and the inability to pattern suspended structures.

Figure 10:
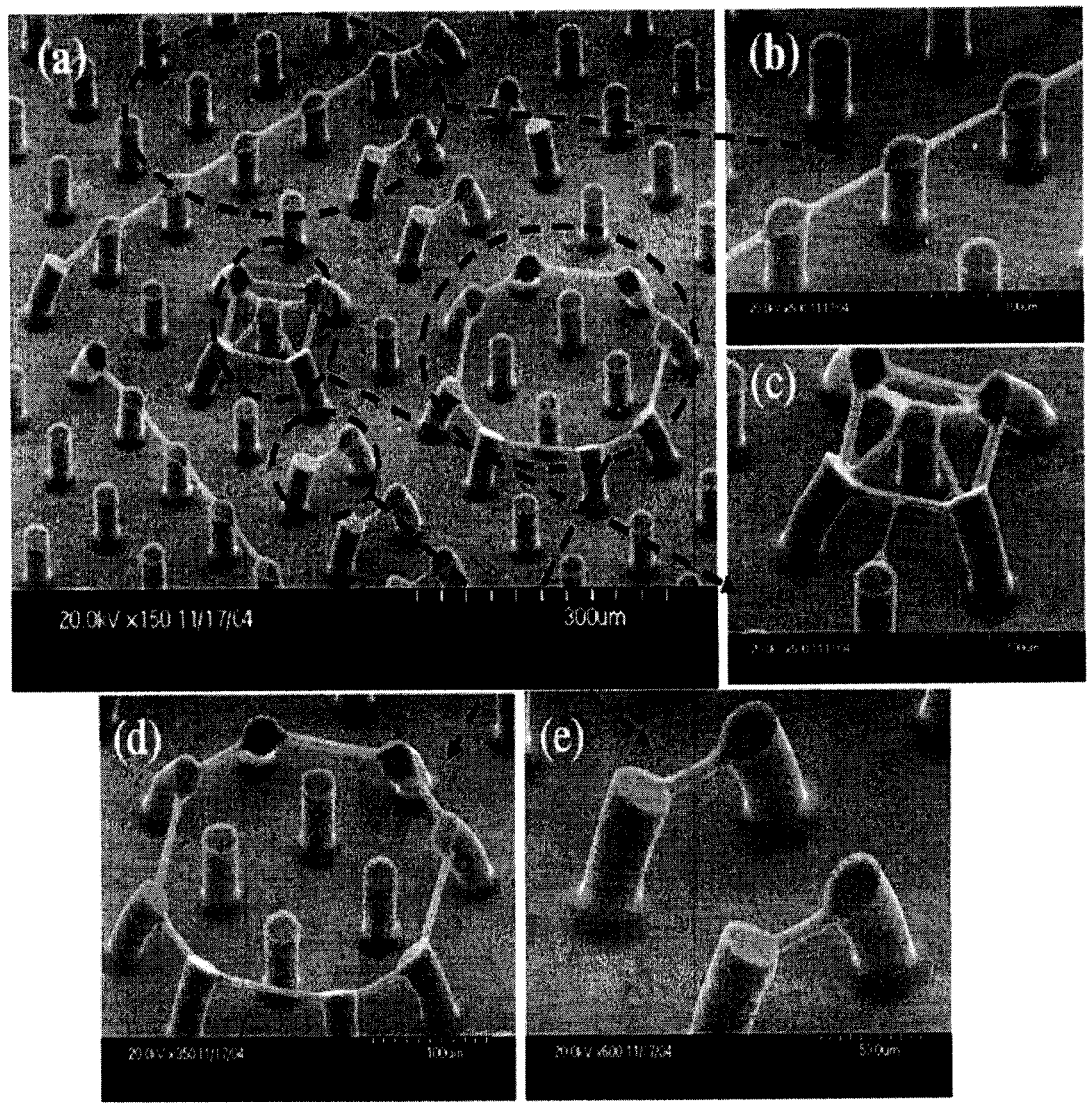
FIGS. 10(a)-(e) show SEM photos from sample 4 of an exemplary method of the present invention.

To avoid exposure of the SU-8 top layer during metal deposition, sample 4 was partially masked during deposition (FIG. 6—step 140). FIG. 10(a) shows a typical SEM picture of sample 4, which was partially masked with a piece of a Si wafer in order to facilitate the alignment of the pattern and focusing of the electron beam in writing the suspended structures by the electron beam writer. The alignment and focusing was performed on the masked area where the gold was deposited. Charging effects during focusing were not observed. The electron beam writing was performed on the unmasked area. FIGS. 10(a)-(e) show different suspended carbon microstructures after pyrolysis including suspended straight microstructures, suspended networks, and suspended rings. The suspended microstructures when pyrolysed, shrunk to about 10 μm in diameter and were about 50-70 μm in length. During pyrolysis, chemical degradation occurs as the starting material breaks down into smaller molecules. As stated above, the SU-8 photoresist consists of an epoxy/phenolic resin which mostly decomposes at temperatures below 600° C. Therefore the suspended carbon microstructures tend to shrink in diameter and length after pyrolysis to about 40% of the original dimensions. It can be seen that after the high temperature pyrolysis process, the carbon posts and suspended bridges shrink isometrically, retaining a major part of their structure and retaining similar shapes as the SU-8 microstructures. FIG. 10(b) shows perfectly horizontal suspended microstructures of diameter of less than 10 μm. In this post, since there is equal pulling force on either side of the post, the stress acting on the post is balanced. "Pulling force" here refers to the force exerted by one of the posts on another post due to the suspension of the microstructure in between them. In FIGS. 10(c) and (d) show that there was bowing of some of the carbon posts due to the radial nature of the drag force components. It can be observed from FIG. 10(e) that in the case of the suspended structures that were patterned in a straight line or between two carbon posts, the bending of the posts occurred only at the posts on the edges because of the unidirectional forces on these posts.

FIG. 10(c) shows some suspended carbon fibers that were formed along with the suspended carbon networks. These carbon nanowires are suspected to be formed due to stretching of residual SU-8 resist that could not be removed during the development step. The pyrolysed suspended carbon microstructures have a higher surface to volume ratio compared with the electron beam fabricated structures, thus making them ideal candidates for high sensitivity applications.

Figure 11:
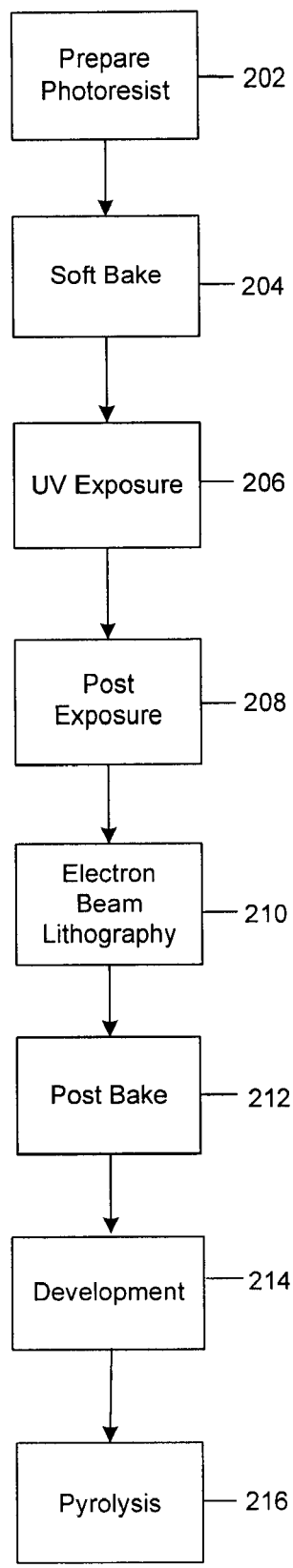
FIG. 11 is a flow chart illustrating another exemplary method of the present invention.

In another exemplary method, depicted in FIG. 11, the initial step is to spin the photoresist (step 202). Doped SU-8 is spun onto a silicon wafer using a Laurell photoresist spinner at 2000 rpm for 30 seconds leaving a thickness of about 100 μm. In step 204, a two step soft bake process is done in a baking oven (10 minutes at 65° C. and 40 minutes at 95° C.) in order to evaporate the solvent in the photoresist. The sample is then allowed to cool and exposed through a mask to a 1000 mJ dose of UV light (365 nm) (step 206). This is used to form the patterns containing the posts. A two step post exposure process is then done (step 208) in a baking oven (1 minute at 65° C. and 12 minutes at 95° C.) in order to promote crosslinking of the exposed photoresist.

In step 210, using an electron beam lithography tool and by focusing the electron beam on the top layer of the SU-8, small lines can be drawn between the different posts resulting in local exposure of the top layer of SU-8 without affecting the layer below. The high absorption of the electron beam by the SU-8 ensures that only the surface layer is exposed. Next, a two step post exposure bake process is done in a baking oven (1 minute at 65° C. and 2 minutes at 95° C.) in order to promote crosslinking of the exposed top layer photoresist sensitized by the electron beam (step 212). In step 214, the sample is allowed to cool down to room temperature and then put in an SU-8 developer solution. With gentle stirring, the sample will develop within ten minutes.

Figure 12:
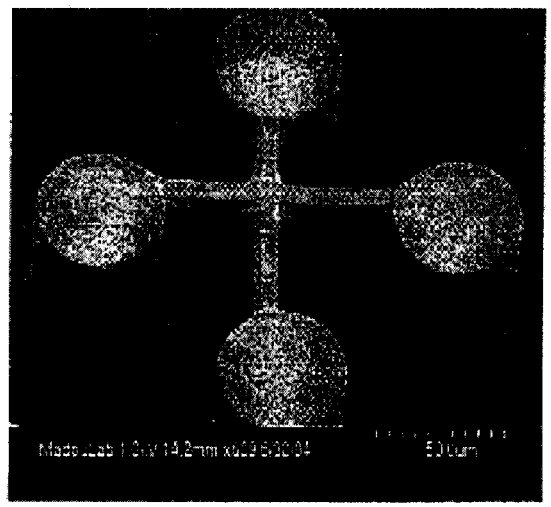
FIG. 12 is a SEM photo of a suspended structure made using the fabrication methods of an exemplary method of the present invention.

Finally, in step 216, the sample undergoes a two step pyrolysis process. The sample is first heated at 300° C. in order to cure the photoresist and ensure good adhesion between the C-MEMS posts and the substrate. During that time, an inert environment is insured by a constant flow of nitrogen in the furnace chamber. This step is followed by a high temperature ramp up to 900° C. in a forming gas environment (5% hydrogen and 95% nitrogen) (step 218). The sample is left for 1 hour at this temperature during which the photoresist transforms into electrically conductive carbon. The resulting structure is shown in FIG. 12.

Figure 13:
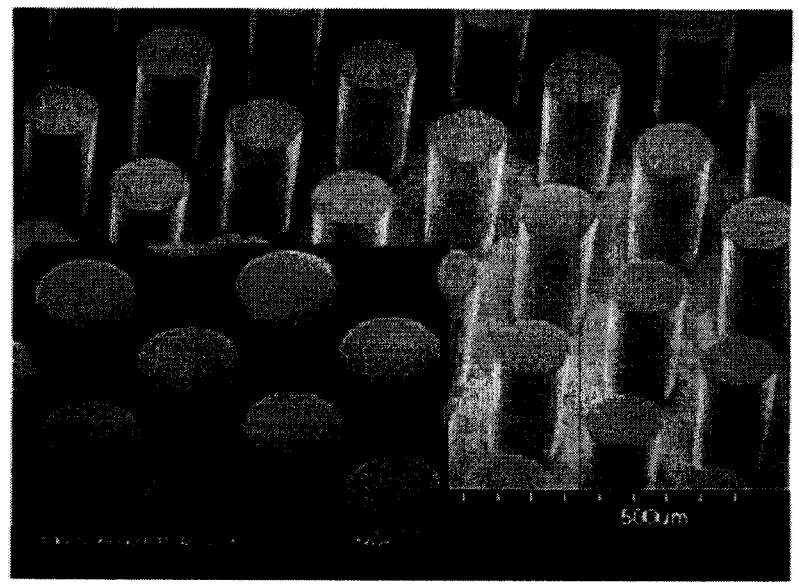
FIG. 13 shows typical photographs of SU-8 pattern formed from different soft baking equipments. The larger photo illustrates hotplate baking, while the insert illustrates oven baking.
Figure 14:
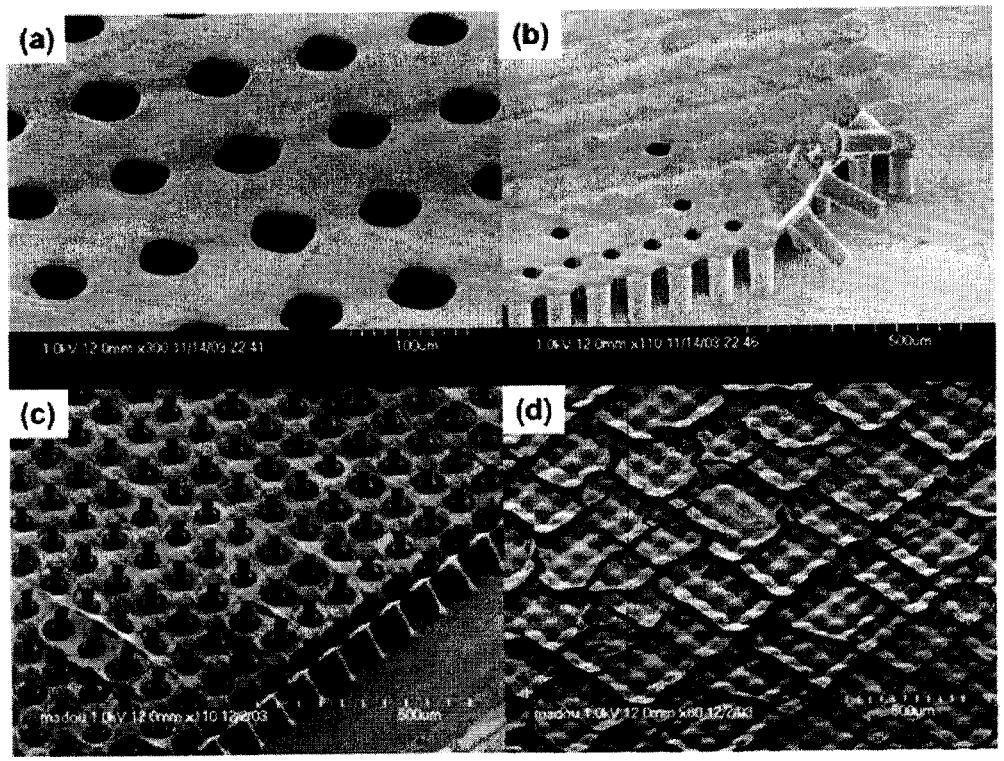
FIGS. 14(a) and (b) are SEM photos of 3-D suspended structures before pyrolysis.
FIGS. 14(c) and (d) are SEM photos of 3-D suspended structures after pyrolysis.

Referring back to the process depicted in FIG. 2, altering the controls and process results in the production of other structures such as, e.g., self organized bunches of carbon posts, plates supported by carbon posts, ribbons, and the like. Thick SU-8 photoresist layers are not only more sensitive to process parameter variations, but also more sensitive to the particular type of equipment used than thin photoresist layers. For example, FIG. 13 shows typical photos of SU-8 structures created by using different soft baking techniques. The insert of FIG. 13 shows SU-8 structures formed using a baking oven, and the results of using a hotplate are shown in the remainder of FIG. 13. Using the same baking parameters (10 min at 65° C. and 80 min at 95° C.), a hard top layer is easily observed when using the baking oven but not when using a simple hotplate. In an oven, the resist is uniformly heated by convection from all sides. Skin formation on the resist is often observed, which further reduces solvent evaporation. For hotplate baking, the resist is heated from below by heat conduction and a temperature gradient develops in the resist layer (higher temperature at the bottom of the resist), making the solvent evaporation easier. Uniform baking of the whole photoresist layer is impossible, especially for ultrathick photoresist. In general, oven baking of straight SU-8 posts tends to lead to T-shaped hats, whereas a hot-plate keeps the original shape more intact. Oven-baking also creates a hard skin on unexposed resist thereby forcing the developer to attack the unexposed resist parts faster from the sides than from the top leading to overhangs and tunnels. (see, e.g., FIG. 14).

Figure 15:
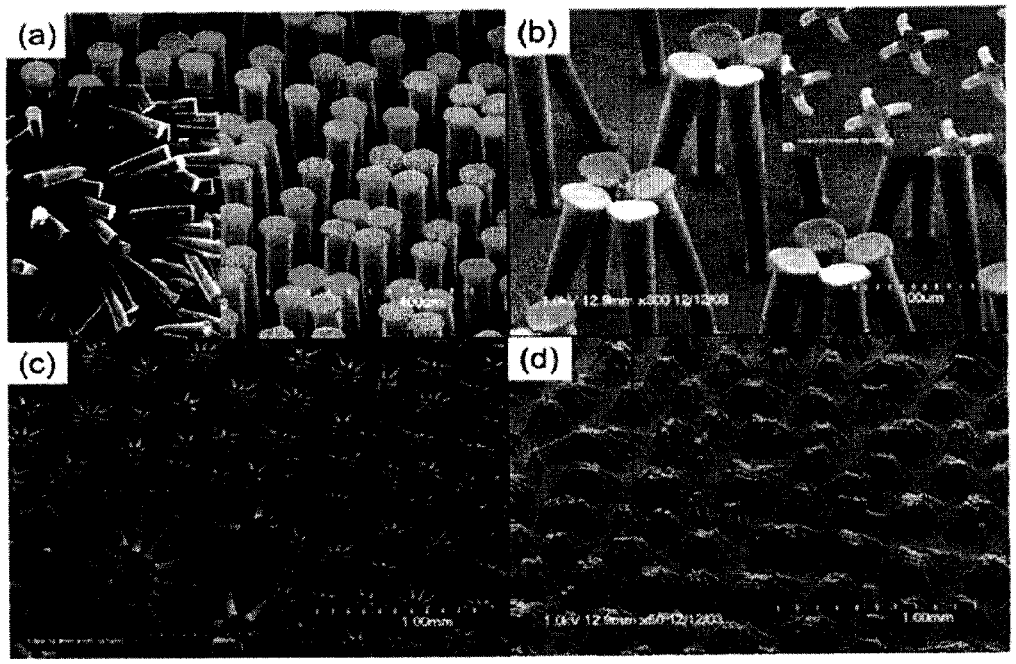
FIG. 15(a) is a SEM photo of self organized patterns of SU-8 structures before pyrolysis.
FIGS. 15(b)-(d) are SEM photos of self organized patterns of carbon structures after pyrolysis.

FIGS. 15(*b*), (*c*) and (*d*) illustrate self-organized groups of carbon posts (bunched posts). This feature is most readily observed for high aspect ratio C-MEMS arrays with posts higher than 300 μm. The SU-8 patterns before pyrolysis shown in FIG. 15(*a*) demonstrate that post aggregation occurred before pyrolysis. When bunching occurs, the bowed posts in each bunch remain structurally intact. This means that the aggregation and/or bunching only takes place after UV exposure, that is, during post bake, or during development, or during drying after development. Experiments were conducted in order to determine during which of these processes the aggregation/bunching occurs. At the post bake temperature, "bunching" could in principle occur as the post bake temperature (65° C.) is above the glass transition temperature of unexposed SU-8 (50-55° C.) and at those temperatures the unexposed area reflows and this could enable the posts to move toward each other. SEM illustrations taken after the post bake indicate that the mask patterns are transferred with high fidelity, which indicates that no aggregation/bunching occurs during the postbake (FIGS. 15(*b*), (*c*), (d)). As shown in FIG. 15(*a*), with too high a pressure on the nitrogen drying gun, the developed high aspect ratio patterns randomly collapsed.

It has been suggested that resist pattern collapse is attributable to the redeposition of partially dissolved resist material during the drying process after development. However, this does not explain the phenomenon described herein, because from the experiments conducted, even if the direction of the gas flow of the drying gun is changed, the same self-organized patterns are still obtained.

Another major pattern alteration mechanism can originate from film shrinkage during crosslinking. The large internal stress for the polymerized SU-8 can have a significant impact on for the fabrication of ultra-thick microstructures. Not only does internal stress alter the patterned structures, but it also can adhesion problems or even cracking failures. The effect caused by the large internal stress can be alleviated by either reducing the total exposed area or by generating discrete small-sized exposed regions. Even for a very large photoresist pattern (as big as a four-inch wafer), the stress problems can be overcome and the photoresist can be successfully turned into C-MEMS without cracks as long as the two step pyrolysis process described herein is used. As described above, the key point is to obtain a fully cross-linked resist. The dominant cause for the bunching of resist posts is believed to be surface tension. When the developer solution is removed gently this pulls posts that are tall and close enough together into symmetric patterns. Since the posts are somewhat sticky, the posts stay joined at the top as long as the pressure of the drying gun is not too high. During pyrolysis, most of the stress is concentrated at the carbon/substrate interface and the stiction of the posts at the top survives the pyrolysis process intact.

Figure 16:
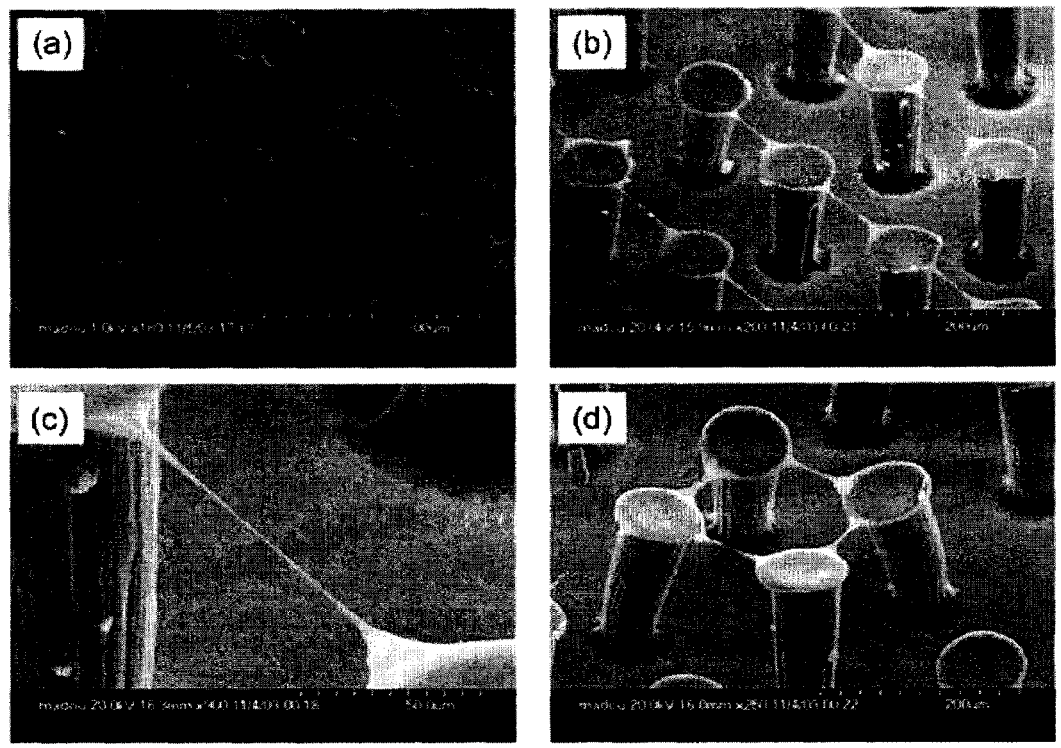
FIG. 16(a) is a SEM photo of a modified SU-8 photoresist before pyrolysis.
FIGS. 16(b), (c) and (d) are SEM photos of suspended carbon fibers fabricated using modified SU-8 photoresist showing C-MEMS after pyrolysis.

Suspended C-MEMS structures were frequently observed as a result of the fabrication methods disclosed herein (see, e.g. FIG. 16). Nontraditional lithography process steps, such as underdevelopment, doping of the photoresist with nanoparticles and controlling the developer flow direction, were introduced to study the mechanisms for the development of the suspended structures.

As discussed above, unexposed resist that has been overbaked encourages sideways attack by the developer leading to overhangs between the exposed features. The underexposed resist features are narrowing toward the substrate as they are more severely attacked from the bottom depending on the amount of underexposure and since the upper layers get more UV exposure resulting in a barrier top layer that is harder to dissolve. Different underdevelopment timing leads to suspended networks (FIG. 16(*a*)) or suspended films (FIG. 16(*b*)). During pyrolysis, uniform shrinkage of the photoresist network results in a suspended carbon network with increased openings as shown in FIG. 16(*c*). In the case of the suspended photoresist film, stress from the pyrolysis process results in a cracking pattern as illustrated in FIG. 16(*d*).

It is difficult to control the timing for underdevelopment because of its sensitivity to the photoresist thickness, exposure dose, and baking condition. It is theorized that, by using SU-8 photoresist doped with $Fe_2O_3$ nanoparticles, for example, the formation of suspended structures can be better controlled. Modified SU-8 is dark brown whereas undoped SU-8 is transparent. Consequently, thick colored resist requires significantly longer overexposure times to transfer patterns. In the case of Fe$_2$O$_3$ doped SU-8, the resist posts and derived carbon posts are much narrower at the bottom than at the top and appear fibrous because of the masking effect of individual or clustered nanoparticles (see, e.g., FIG. 17(*d*)). The more open structure at the resist/substrate interface enables better control of the sideways flow of developer into the structure. If suspended parts are desired, oven-baking can create the overhang and underdeveloped to avoid taking it away. If the overhangs are not desired, increased developments times can be used to eliminate the overhangs.

Figure 17:
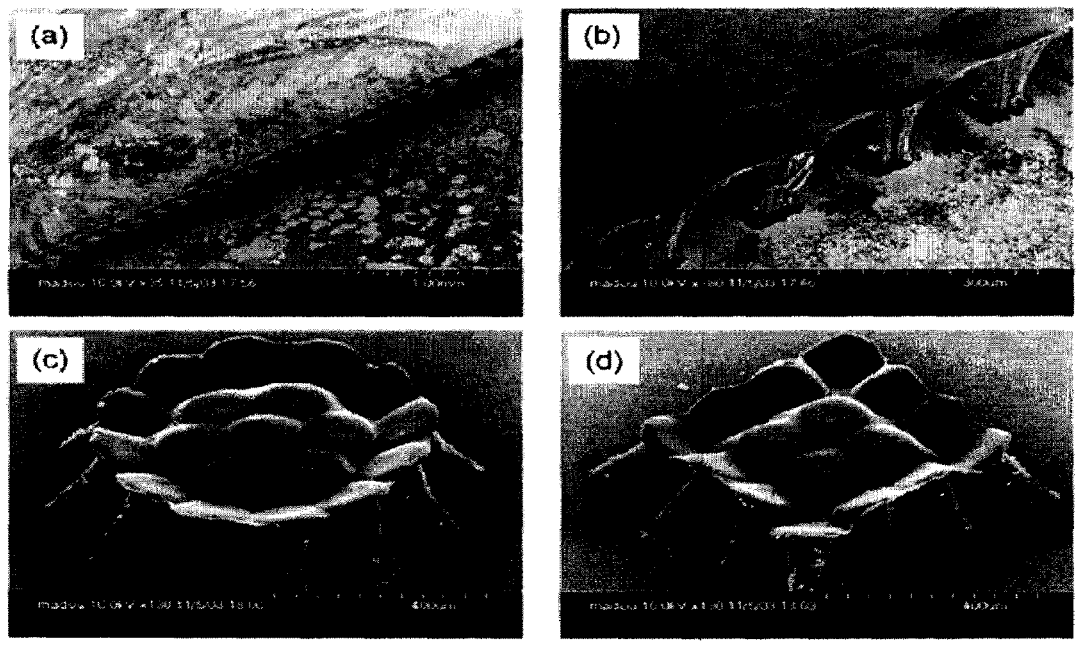
FIGS. 17(a)-(d) are SEM photos of suspended C-MEMS structures formed from modified SU-8.

By proper control of the soft bake, exposure, and development time, suspended carbon fibers can also be built, as shown in FIGS. 16(*b*), (*c*), and (*d*). FIG. 16(*a*) shows a typical SEM photo of the precursor SU-8 photoresist pattern before pyrolysis. Unlike the bowed posts in self-organized bunching, carbon posts here are kept straight because of their wiring to the surrounding posts that keeps them balanced. The diameter of the suspended carbon fibers obtained is submicron. By careful control of the geometric distribution of the posts in the array and the overexposure dose, a wide variety of suspended and complex C-MEMS structures, such as plates and bridges, as shown in FIGS. 17(*a*)-(*d*), can be fabricated.

Figure 18:
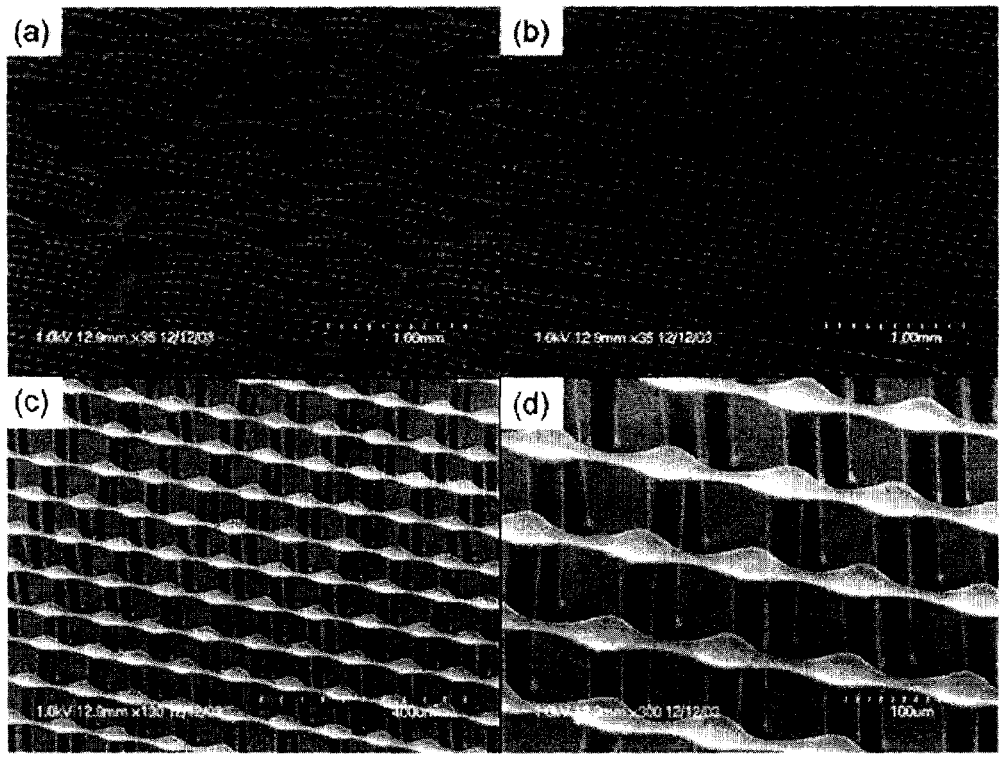
FIGS. 18(a)-(d) are SEM photos of suspended C-MEMS ribbons.

In order to improve patterning quality and shorten the processing time, both immersion and spray development can be used to develop thick and dense SU-8 arrays. When the development speed of the immersion method is slowed down, spray development can be used. By actively controlling the spray direction of developer to attack the exposed resist from one direction only (as opposed to the passive flow control described above), complex structures such as ribbon-like carbon structures can be fabricated. After pyrolysis, suspended carbon ribbons result as shown in FIGS. 18(*a*)-(*d*).

Figure 19:
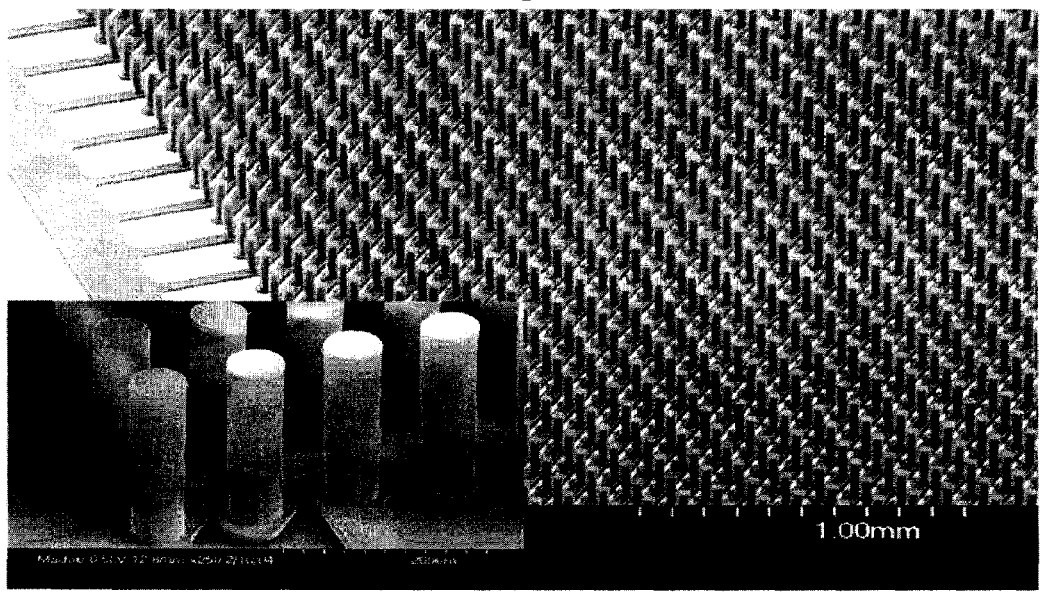
FIG. 19 shows a typical two-level C-MEMS electrode with underneath carbon contacts. The insert image shows enlarged SU-8 two-level structures.

The processes described above can easily be extended to two layer or multi-layer C-MEMS structures. For example, a two-layer C-MEMS structure is shown in FIG. 19. In the C-MEMS battery depicted in FIG. 19, one layer of the carbon constitutes the current collector for rows of anode and cathode posts in the second layer of carbon.

The mechanical property of the suspended carbon structures has also been analyzed using a nanoindentation method. FIG. 20 shows a typical curve of a nano-indentation experiment on a thin film. The quantities shown are P$_{max}$: the maximum indentation load; d: the indenter displacement at maximum load; d$_r$: the final depth of the contact impression after unloading; d$_b$: d-d$_r$; S: the initial unloading stiffness. Instead of indenting the thin film, the tip is used to deflect the suspended beam. As shown in FIG. 21, the overall displacement, d, includes the displacement of the beam d$_b$ and the displacement of the tip inside the beam d$_r$. To estimate the Young's modulus of the suspended beam, the following equation can be used:

$$d_b = \frac{Pl^3}{192 \cdot EI}$$

where P is the load, l is the beam length, E is the Young's modulus, and I is the area of moment of the inertia about the centroidal axis of the beam cross section. Therefore, the Young's modulus can be express as:

$$E = \frac{Pl^3}{192 \cdot Id_b}$$

As shown in the table of FIG. 22, it was found that the calculated Young's moduli are not consistent in the whole force range (2-20 mN).

In the foregoing specification, the invention has been described with reference to specific embodiments thereof. It will, however, be evident that various modifications and changes may be made thereto without departing from the broader spirit and scope of the invention. For example, each feature of one embodiment can be mixed and matched with other features shown in other embodiments. Features and processes known to those of ordinary skill may similarly be incorporated as desired. Additionally and obviously, features may be added or subtracted as desired. Accordingly, the invention is not to be restricted except in light of the attached claims and their equivalents.

What is claimed:

1. A method for forming suspended carbon structures comprising the steps of exposing a negative photoresist to UV light;
   patterning lines with electron beam lithography to the top surface of the photoresist between UV exposed areas;
   pyrolyzing the patterned negative photoresist in a two step pyrolysis process in a first inert gas atmosphere; and
   forming carbon posts with carbon structures suspended therebetween.

2. The method of claim 1 wherein the negative photoresist comprises SU-8 photoresist.

3. The method of claim 1 wherein the negative photoresist is doped with Fe2O3 nanoparticles.

4. The method of claim 1 further comprising the steps of
   spin coating a film of negative photoresist onto a substrate;
   soft baking the negative photoresist and substrate;
   post exposure baking the photoresist; and
   developing the photoresist.

5. The method of claim 1 wherein the pyrolyzing step includes
   post baking the photoresist a first predetermined temperature; and
   heating the photoresist to a second predetermined temperature.

6. The method of claim 1 wherein the first inert gas atmosphere comprises a N2 atmosphere.

7. The method of claim 1 further comprising the step of exposing the photoresist at a third predetermined temperature for a predetermined time in a second inert gas atmosphere.

8. The method of claim 7 wherein the second inert gas atmosphere comprises approximately 5% H2 and approximately 95% N2.

9. The method of claim 1 further comprising depositing a metal layer onto the substrate.

10. The method of claim 9 wherein the metal comprises gold.

11. The method of claim 9 wherein the metal comprises titanium.

12. The method of claim 9 wherein the metal is deposited by electron beam evaporation.

13. The method of claim 9 wherein the metal is sputtered onto the substrate.

14. The method of claim 9 further comprising etching away the metal layer.

15. The method of claim 1 further comprising masking of the substrate.

16. A method of forming suspended carbon structures comprising:
- exposing a negative photoresist to a source of UV light;
- patterning the photoresist using an electron beam writer;
- developing the photoresist; and
- heating the photoresist in an oxygen-free environment to a first temperature;
- heating the photoresist in an oxygen-free environment to a second temperature; and
- forming three dimensional C-MEMS structures comprising carbon posts with carbon structures suspended therebetween.

17. The method of claim 16 further comprising:
- spin coating a film of negative photoresist onto a substrate;
- soft baking the negative photoresist and substrate;
- post exposure baking the photoresist; and
- developing the photoresist.

18. The method of claim 16, wherein the three dimensional structure comprises a carbon ribbon.

19. The method of claim 16, wherein the three dimensional structure comprises a carbon flower.

20. The method of claim 16, wherein the three dimensional structure comprises a suspended bridge.

21. The method of claim 16, wherein the three dimensional structure comprises a carbon wire.

22. The method of claim 16, wherein the three dimensional structure comprises a carbon plate.

23. The method of claim 16, wherein the three dimensional structure comprises organized bunches of carbon posts.

* * * * *